United States Patent
Lee et al.

(10) Patent No.: US 10,483,483 B2
(45) Date of Patent: Nov. 19, 2019

(54) ELECTROLUMINESCENT DEVICE AND ELECTROLUMINESCENT DISPLAY DEVICE INCLUDING THE SAME

(71) Applicant: LG Display Co., Ltd., Seoul (KR)

(72) Inventors: Hak-Min Lee, Yongin-si (KR); Young-Jun Yu, Seoul (KR); Hee-Jin Kim, Yongin-si (KR); Sung-Soo Park, Gwacheon-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/836,732

(22) Filed: Dec. 8, 2017

(65) Prior Publication Data

US 2018/0175320 A1 Jun. 21, 2018

(30) Foreign Application Priority Data

Dec. 16, 2016 (KR) .................... 10-2016-0172405

(51) Int. Cl.
*H01L 51/52* (2006.01)
*G09G 3/3258* (2016.01)
*H01L 27/32* (2006.01)
*H01L 51/50* (2006.01)

(52) U.S. Cl.
CPC ....... *H01L 51/5221* (2013.01); *G09G 3/3258* (2013.01); *H01L 51/5206* (2013.01); *H01L 51/5265* (2013.01); *G09G 2310/0264* (2013.01); *H01L 27/3276* (2013.01); *H01L 51/5056* (2013.01); *H01L 51/5218* (2013.01)

(58) Field of Classification Search
CPC ............. H01L 51/5221; H01L 51/5206; H01L 51/5056; H01L 51/5265; H01L 27/3276; H01L 51/5218; G09G 3/3258; G09G 2310/0264
See application file for complete search history.

(56) References Cited

U.S. PATENT DOCUMENTS

| | | | |
|---|---|---|---|
| 8,809,079 B2 | 8/2014 | Chen et al. | |
| 2013/0153866 A1 | 6/2013 | Chen et al. | |
| 2014/0332798 A1 | 11/2014 | Chen et al. | |
| 2016/0285043 A1* | 9/2016 | Lee | H01L 51/5253 |
| 2016/0285050 A1* | 9/2016 | Yang | H01L 27/3258 |
| 2016/0329383 A1* | 11/2016 | Li | H01L 51/5218 |
| 2017/0062767 A1* | 3/2017 | Bao | H01L 51/5056 |
| 2019/0027705 A1 | 1/2019 | Chen et al. | |

FOREIGN PATENT DOCUMENTS

| | | |
|---|---|---|
| CN | 103620807 A | 3/2014 |
| CN | 103700776 A | 4/2014 |
| CN | 104409658 A | 3/2015 |
| CN | 105428550 A | 3/2016 |

OTHER PUBLICATIONS

China National Intellectual Property Administration, Office Action, CN Patent Application No. 201711345378.5, dated Mar. 28, 2019, 18 pages.

* cited by examiner

*Primary Examiner* — Abhishek Sarma
(74) *Attorney, Agent, or Firm* — Fenwick & West LLP

(57) ABSTRACT

Provided are an electroluminescent device and an electroluminescent display device. The electroluminescent device includes an anode and a cathode facing each other, a light compensation layer located between the anode and the cathode and having a first refractive index, and an emitting material layer located between the light compensation layer and the cathode, and having a second refractive index higher than the first refractive index.

12 Claims, 12 Drawing Sheets

ELECTROLUMINESCENT DEVICE AND ELECTROLUMINESCENT DISPLAY DEVICE INCLUDING THE SAME

CROSS-REFERENCE TO RELATED APPLICATIONS

This application claims the benefit under 35 U.S.C. § 119(a) of Republic of Korea Patent Application No. 2016-0172405, filed on Dec. 16, 2016, in the Korean Intellectual Property Office, which is incorporated herein by reference in its entirety.

BACKGROUND

1. Technical Field

The present disclosure relates to an electroluminescent device, and more particularly, to an electroluminescent device having high luminous efficiency due to a soft cavity effect, and an electroluminescent display device including the same.

2. Discussion of the Related Art

With the advancement of an information society, the demand for a display device which displays an image is increasing in various forms. A flat panel display device including an electroluminescent display device, such as a liquid crystal display (LCD) device, a plasma display panel (PDP) device, or an organic light-emitting diode (OLED) display device, which is thinner and lighter in weight than a conventional cathode ray tube (CRT) display device is being actively researched and commercialized.

The OLED display device which is an electroluminescent display device includes an OLED as an essential component and does not need a backlight used for an LCD device which is a non-light-emitting device, and may thus be manufactured to be light in weight and thin. Furthermore, the OLED display device is advantageous in terms of power consumption, can be driven with a low voltage, and has a high response rate, when compared to the LCD device.

For example, the OLED includes a hole injection layer (HIL), a hole transporting layer (HTL), an emitting material layer (EML), an electron transporting layer (ETL), and an electron injection layer (EIL) which are sequentially stacked between an anode and a cathode. The HIL, the HTL, the EML, the ETL, and the EIL are formed by a deposition process.

However, there is a limit in manufacturing a large-sized OLED using the deposition process. Thus, a soluble OLED formed by a soluble process has been proposed.

For example, the soluble OLED may include an anode, a cathode facing the anode, an EML located between the anode and the cathode, a HIL located between the anode and the EML, an ETL located between the EML and the cathode.

However, there is a limit in achieving a cavity effect in such an OLED having a multilayered structure. Accordingly, the brightness of the OLED and an OLED display device including the same are limited.

SUMMARY

Embodiments relate to solving a problem of the brightness of an electroluminescent device and an electroluminescent display device including the same by increasing a cavity in the electroluminescent device.

One or more embodiments relate to an electroluminescent device including an anode and a cathode facing each other, a light compensation layer located between the anode and the cathode and having a first refractive index, and an emitting material layer located between the light compensation layer and the cathode, and having a second refractive index higher than the first refractive index.

One or more embodiments relate to an electroluminescent display device including a substrate, the above-described electroluminescent device located on a substrate, and a thin-film transistor located between the substrate and the electroluminescent device, and connected to the electroluminescent device.

Advantages and features of the disclosure will be set forth in part in the description, which follows and in part will become apparent to those having ordinary skill in the art upon examination of the following or may be learned from practice of the disclosure. Other advantages and features of the embodiments herein may be realized and attained by the structures particularly pointed out in the written description and claims herein as well as the appended drawings.

It is to be understood that both the foregoing general description and the following detailed description are explanatory, and are intended to provide further explanation of the embodiments as claimed.

BRIEF DESCRIPTION OF THE DRAWINGS

The accompanying drawings, which are included to provide a further understanding of the disclosure, are incorporated in and constitute a part of this specification, illustrate implementations of the disclosure and together with the description serve to explain the principles of embodiments of the disclosure.

DETAILED DESCRIPTION

Figure 1:
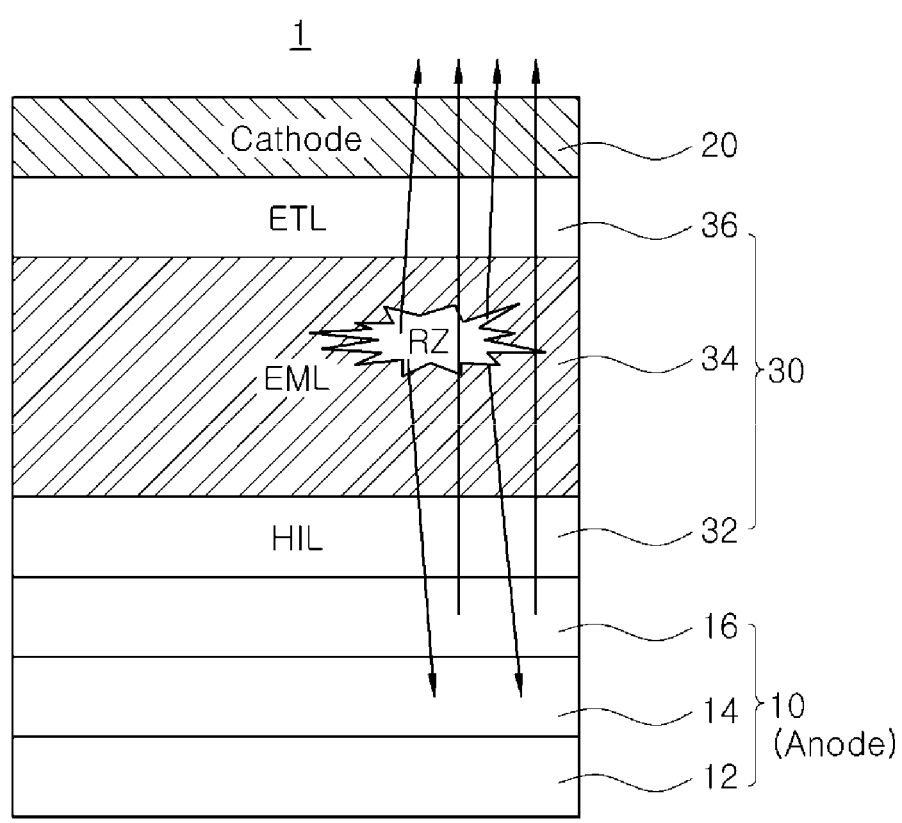
FIG. 1 is a schematic cross-sectional view showing an organic light-emitting diode (OLED).

Reference will now be made in detail to embodiments of the present disclosure, examples of which are illustrated in the accompanying drawings. In the following description, when a detailed description of well-known functions or configurations related to this document is determined to unnecessarily cloud the gist of an embodiment of the disclosure, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a certain order. Like reference numerals designate like elements throughout. Names of the respective elements used in the following description are selected only for convenience in writing the specification and may be thus different from those used in actual products.

FIG. 1 is a schematic cross-sectional view of an organic light-emitting diode (OLED).

As illustrated in FIG. 1, an OLED 1 may include an anode 10, a cathode 20 facing the anode 10, and an organic emissive layer 30 which is located between the anode 10 and the cathode 20 and includes a hole injection layer (HIL) 32, an emitting material layer (EML) 34, and an electron transporting layer (ETL) 36.

In this case, the anode 10 includes first and second transparent electrode layers 12 and 16, and a reflective electrode layer 14 located between the first and second transparent electrode layers 12 and 16. Light emitted from the EML 34 passes through the cathode 20 and forms an image. That is, the OLED 1 is a top-emission type.

However, the OLED 1 having a multilayered structure has a limit in achieving a cavity effect. That is, the EML 34 and the HIL 32 have substantially the same refractive index, and thus the cavity effect is achieved when light emitted from the EML 34 is reflected by the reflective electrode layer 14 of the anode 10. Accordingly, the cavity effect is reduced.

Furthermore, since the EML 34 has a large thickness and a recombination zone RZ of a hole and an electrode is changed due to the ETL 36, the cavity effect is reduced.

Figure 2:
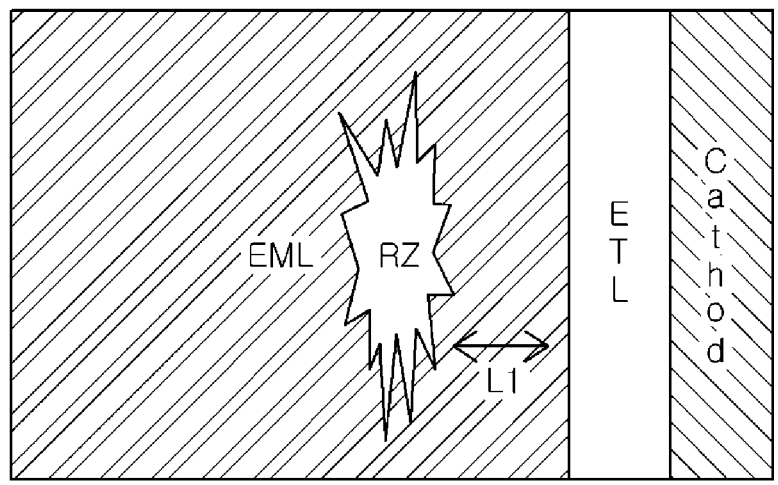
FIG. 2 is a diagram for explaining a cavity phenomenon occurring in the OLED of FIG. 1.

That is, referring to FIG. 2 which is a diagram for explaining the cavity phenomenon occurring in the OLED of FIG. 1, injection of an electron is delayed, and the recombination zone RZ is shifted towards the ETL 36 due to the ETL 36 and the thick EML 34. Thus, a distance L1 between the recombination zone RZ and the ETL 36 for achieving the cavity effect is reduced. Accordingly, the luminous efficiency, i.e., the brightness, of the OLED 1 is reduced due to the reduction in the cavity effect.

In addition, carrier balance is broken due to the delay in the injection of the electrons, thus further decreasing the luminous efficiency of the OLED 1.

In order to solve the above problems, the present disclosure provides an electroluminescent device including an anode and a cathode which face each other, a light compensation layer located between the anode and the cathode and having a first refractive index, and an EML located between the light compensation layer and the cathode and having a second refractive index higher than the first refractive index.

In the electroluminescent device according to the present disclosure, the difference between the first refractive index and the second refractive index is 0.4 or more.

In the electroluminescent device according to the present disclosure, the EML is in contact with the cathode.

The electroluminescent device according to the present disclosure further includes a HIL located between the EML and the light compensation layer or between the light compensation layer and the anode.

In the electroluminescent device according to the present disclosure, the HIL has a third refractive index higher than the first refractive index.

In the electroluminescent device according to the present disclosure, the light compensation layer has a thickness smaller than those of the EML and the HIL.

In the electroluminescent device according to the present disclosure, the anode includes a first transparent electrode layer.

In the electroluminescent device according to the present disclosure, the anode further includes a second transparent electrode layer facing the first transparent electrode layer, and a reflective electrode layer located between the first and second transparent electrode layers.

According to another aspect, the present disclosure provides an electroluminescent display device including a substrate, the above-described electroluminescent device located on the substrate, and a thin-film transistor (TFT) located between the substrate and the electroluminescent device and connected to the electroluminescent device.

Hereinafter, the present disclosure will be described in detail with reference to the accompanying drawings.

Figure 3:
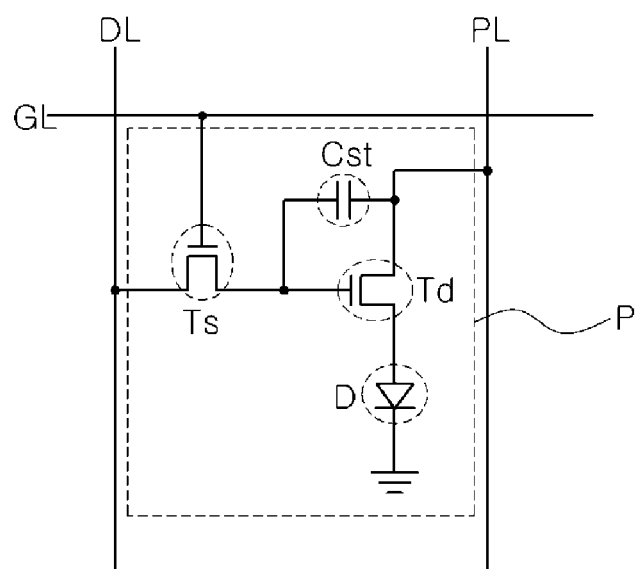
FIG. 3 is a schematic circuit diagram of an electroluminescent display device according to the present disclosure.

FIG. 3 is a schematic circuit diagram of an electroluminescent display device according to the present disclosure.

As illustrated in FIG. 3, a gate line GL, a data line DL, and a power line PL intersecting one another to define a pixel region P are formed in an electroluminescent display device 100. A switching thin-film transistor (TFT) Ts, a driving TFT Td, and a storage capacitor Cst, and an electroluminescent device D are formed in the pixel region P.

The switching TFT Ts is connected to the gate line GL and the data line DL. The driving TFT Td and the storage capacitor Cst are connected between the switching TFT Ts and the power line PL. The electroluminescent device D is connected to the driving TFT Td.

In the electroluminescent display device 100, when the switching TFT Ts is turned on according to a gate signal supplied to the gate line GL, a data signal supplied to the data line DL is supplied to a gate electrode of the driving TFT Td and an electrode of the storage capacitor Cst via the switching TFT Ts.

The driving TFT Td is turned on according to the data signal supplied to the gate electrode, and thus, current which is proportional to the data signal flows from the power line PL to the electroluminescent device D via the driving TFT Td. Then, the electroluminescent device D emits light with brightness which is proportional to the current flowing via the driving TFT Td.

In this case, the storage capacitor Cst is charged with a voltage which is proportional to the data signal and thus a voltage of the gate electrode of the driving TFT Td is maintained constant for a period of one frame.

Accordingly, the electroluminescent display device 100 may display a desired image.

Figure 4:
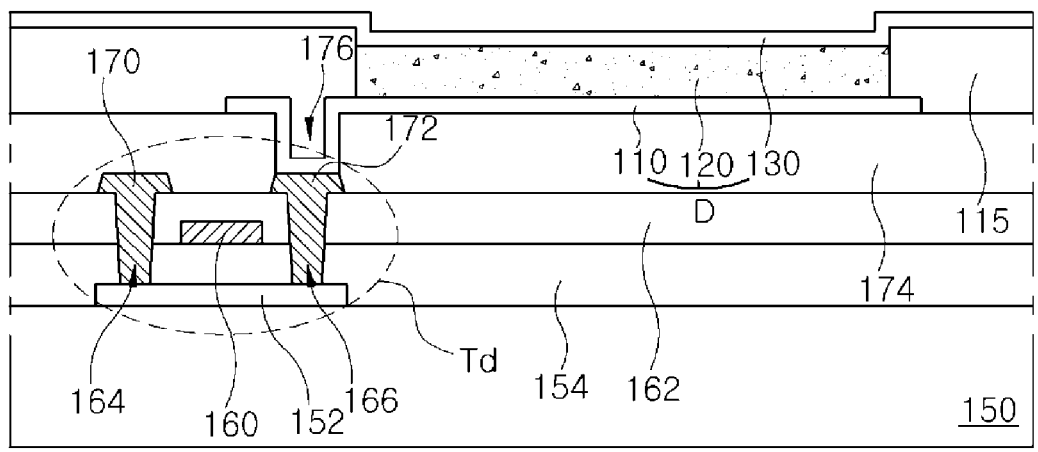
FIG. 4 is a schematic cross-sectional view of an electroluminescent display device according to the present disclosure.

FIG. 4 is a schematic cross-sectional view of an electroluminescent display device according to the present disclosure.

As illustrated in FIG. 4, a driving TFT Td and an electroluminescent device D connected thereto are located on a substrate 150.

The substrate 150 may be a glass substrate or a plastic substrate formed of a polymer such as a polyimide.

Although not shown, a buffer layer formed of an inorganic insulating material such as silicon oxide or silicon nitride may be formed on the substrate 150.

The driving TFT Td is connected to a switching TFT (not shown), and includes a semiconductor layer 152, a gate electrode 160, a source electrode 170, and a drain electrode 172.

The semiconductor layer 152 may be formed on the substrate 150 which is a flexible substrate, and may be formed of an oxide semiconductor material or polycrystalline silicon.

When the semiconductor layer 152 is formed of the oxide semiconductor material, a light-shielding pattern (not shown) may be formed below the semiconductor layer 152. The light-shielding pattern prevents light from being incident on the semiconductor layer 152 to prevent the semiconductor layer 152 from being degraded due to the light. Alternatively, the semiconductor layer 152 may be formed of polycrystalline silicon. In this case, opposite edge portions of the semiconductor layer 152 may be doped with impurities.

A gate insulating film 154 formed of an insulating material is formed on the semiconductor layer 152 to correspond to the entire flexible substrate 150. The gate insulating film 154 may be formed of an inorganic insulating material such as silicon oxide or silicon nitride.

The gate electrode 160 formed of a conductive material such as a metal may be formed on the gate insulating film 154 to correspond to a center of the semiconductor layer 152. The gate electrode 160 is connected to the switching TFT.

Although the gate insulating film 154 is formed over the entire flexible substrate 150, the gate insulating film 154 may be patterned to the same shape as the gate electrode 160.

An interlayer insulating film 162 formed of an insulating material is formed on the gate electrode 160 to correspond to the entire substrate 150. The interlayer insulating film 162 may be formed of an inorganic insulating material such as silicon oxide or silicon nitride or an organic insulating material such as benzocyclobutene or photo-acryl.

The interlayer insulating film 162 has first and second contact holes 164 and 166 which expose opposite sides of the semiconductor layer 152. The first and second contact holes 164 and 166 are located at opposite sides of the gate electrode 160 to be spaced apart from the gate electrode 160.

Here, the first and second contact holes 164 and 166 are also formed inside the gate insulating film 154. Alternatively, when the gate insulating film 154 is patterned to the same shape as the gate electrode 160, the first and second contact holes 164 and 166 may be formed only inside the interlayer insulating film 162.

The source electrode 170 and the drain electrode 172 formed of a conductive material such as a metal are formed on the interlayer insulating film 162.

The source electrode 170 and the drain electrode 172 are spaced apart from each other with respect to the gate electrode 160, and are in contact with the opposite sides of the semiconductor layer 152 via the first and second contact holes 164 and 166. The source electrode 170 is connected to the power line PL of FIG. 3.

The semiconductor layer 152, the gate electrode 160, the source electrode 170, and the drain electrode 172 form the driving TFT Td. The driving TFT Td has a coplanar structure, in which the gate electrode 160, the source electrode 170, and the drain electrode 172 are located on the semiconductor layer 152.

Alternatively, the driving TFT Td may have an inverted staggered structure, in which the gate electrode 160 is located below the semiconductor layer 152 and the source electrode 170 and the drain electrode 172 are located on the semiconductor layer 152. In this case, the semiconductor layer 152 may be formed of amorphous silicon.

The switching TFT (not shown) may have substantially the same structure as the driving TFT Td.

A protective layer 174 having a drain contact hole 176 exposing the drain electrode 172 of the driving TFT Td is formed covering the driving TFT Td.

An anode 110 connected to the drain electrode 172 of the driving TFT Td via the drain contact hole 176 is formed on the protective layer 174 for each pixel region such that anodes 110 in the pixel regions are separated from each other.

The anode 110 may be formed of a conductive material having a relatively high work function. For example, the anode 110 may be formed of a transparent conductive material such as indium-tin-oxide (ITO) or indium-zinc-oxide (IZO).

When an electroluminescent display device according to the present disclosure is a top-emission type, a reflective electrode or a reflective layer may be further formed below the anode 110. For example, the anode 110 may have a triple-layer structure including a first transparent electrode layer, a reflective electrode layer formed of an aluminum-palladium-copper (APC) alloy, and a second transparent electrode layer.

A bank layer 115 is formed on the protective layer 174 to cover edges of the anode 110. The bank layer 115 exposes a center of the anode 110 corresponding to the pixel region.

An organic emissive layer 120 is formed on the anode 110. A structure of the organic emissive layer 120 will be described in detail below.

A cathode 130 is formed on the substrate 150 on which the organic emissive layer 120 is formed. The cathode 130 is formed of a conductive material having a relatively small work function to cover an entire display area. For example, the cathode 130 may be formed of one selected from among aluminum (Al), magnesium (Mg), and an Al—Mg alloy.

The anode 110, the organic emissive layer 120, and the cathode 130 form the electroluminescent device D.

Figure 5:
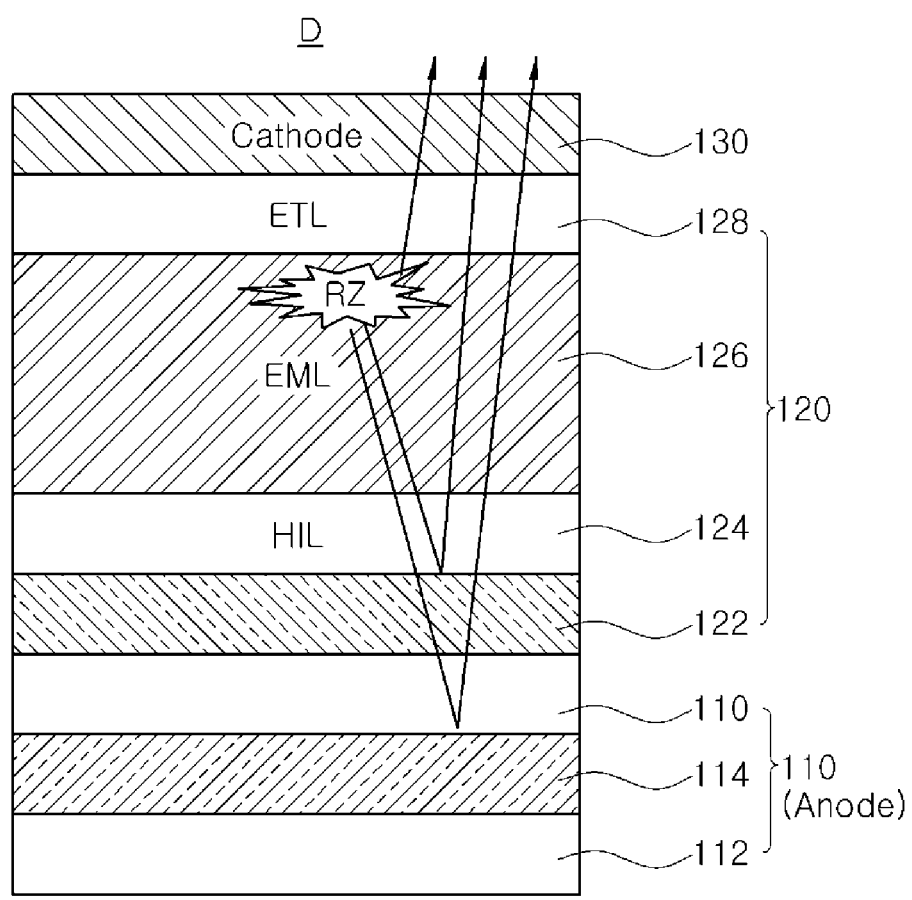
FIG. 5 is a schematic cross-sectional view of an electroluminescent device according to a first embodiment of the present disclosure.

FIG. 5 is a schematic cross-sectional view of electroluminescent device according to a first embodiment of the present disclosure.

As illustrated in FIG. 5, an electroluminescent device D according to a first embodiment of the present disclosure may include an anode 110 including a first transparent electrode layer 112, a reflective electrode layer 114, and a second transparent electrode layer 110, a cathode 130 facing the anode 110, and an organic emissive layer 120 which is located between the anode 110 and the cathode 130 and includes a light compensation layer 122, a HIL 124, an EML 126, and an ETL 128.

The light compensation layer 122, the HIL 124, the EML 126, and the ETL 128 are sequentially stacked on the anode 110. That is, the EML 126 is located between the anode 110 and the cathode 130, and the light compensation layer 122 is located between the anode 110 and the EML 126. The HIL 124 is located between the light compensation layer 122 and the EML 126. The ETL 128 is located between the EML 126 and the cathode 130.

Alternatively, the light compensation layer 122 may be located between the HIL 124 and the EML 126.

Although not shown, an HTL may be located between the HIL 124 and the EML 126.

Although only one pixel region is illustrated in FIG. 5, the electroluminescent device D may include red, green, and blue pixel regions, and the organic emissive layer 120 included in the electroluminescent device D in each of the red, green, and blue pixel regions may have a different thickness. For example, the organic emissive layer 120 in the green pixel region may have a thickness smaller than that of the organic emissive layer 120 in the red pixel region and greater than that of the organic emissive layer 120 in the blue pixel region.

In the anode 110, the first and second transparent electrode layers 112 and 110 may be each formed of a transparent conductive material such as ITO or IZO, and the reflective electrode layer 114 may be formed of a highly reflective material such as Al or an APC alloy.

The cathode 130 may be formed of one selected from among Al, Mg, and an Al—Mg alloy, and have a thin thickness to transmit light therethrough The EML 126 may include an inorganic emitting material such as quantum dots or an organic emitting material. That is, the electroluminescent display device 100 according to the present disclosure may be an OLED display device or a quantum-dot light-emitting diode (QLED) display device.

The light compensation layer 122 has a refractive index lower than those of the HIL 124 and the EML 126. The light compensation layer 122 may have a first refractive index, and the HIL 124 and the EML 126 may respectively have second and third refractive indices. The difference between the first and second refractive indices and the difference between the first and third indices may be 0.4 or more.

For example, the first refractive index may be about 1.2 to 1.6. The second and third refractive indices may be each about 1.6 to 2.0. The second refractive index and the third refractive index may be substantially the same.

The light compensation layer 122 has a thickness smaller than those of the HIL 124 and the EML 126. For example, the thickness of the light compensation layer 122 may be about ⅖ to 1/10 times that of the HIL 124 and may be about ⅕ to 1/20 times that of the EML 126.

For example, the light compensation layer 122 may be formed of an amine compound.

In the electroluminescent device D described above, a hole from the anode 110 and an electron from the cathode 130 combine with each other in a recombination zone RZ located in the EML 126 and thus light is emitted.

A part of light emitted from the EML 126 is reflected at a boundary between the HIL 124 and the light compensation layer 122 toward the cathode 130. The remaining light is reflected from the reflective electrode layer 114 toward the cathode 130.

That is, in the present disclosure, light is reflected within the organic emissive layer 120, and the reflection of the light within the organic emissive layer 120 will be referred to as a soft cavity effect.

In other words, as the light compensation layer 122 having a low refractive index is arranged below the HIL 124 or between the HIL 124 and the EML 126, the cavity phenomenon occurs in the organic emissive layer 120. Accordingly, the luminous efficiencies, i.e., the brightnesses, of the electroluminescent device D and the electroluminescent display device 100 are improved.

Figure 6:
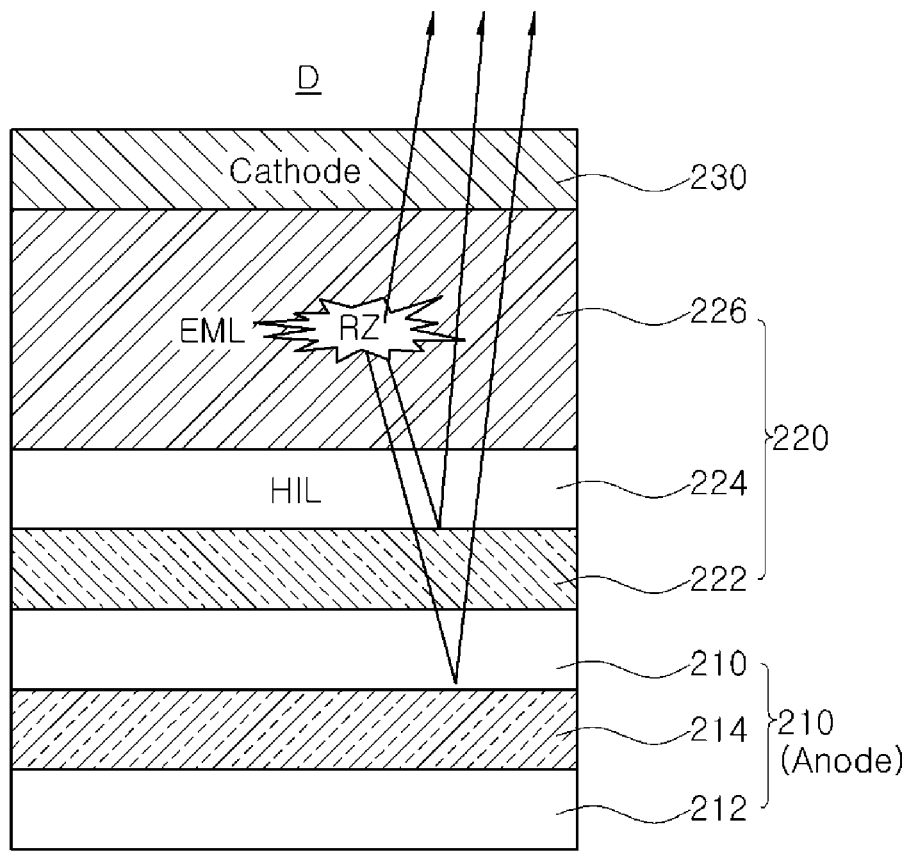
FIG. 6 is a schematic cross-sectional view of an electroluminescent device according to a second embodiment of the present disclosure.

FIG. 6 is a schematic cross-sectional view of an electroluminescent device D according to a second embodiment of the present disclosure.

As illustrated in FIG. 6, an electroluminescent device D according to the second embodiment of the present disclosure may include an anode 210 including a first transparent electrode layer 212, a reflective electrode layer 214, and a second transparent electrode layer 216; a cathode 230 facing the anode 110; and an organic emissive layer 220 located between the anode 210 and the cathode 230 and including a light compensation layer 222, a HIL 224, and an EML 226.

The light compensation layer 222, the HIL 224, and the EML 226 are sequentially stacked on the anode 210. That is, the EML 226 is located between the anode 210 and the cathode 230 and is in contact with the cathode 230. The light compensation layer 222 is located between the anode 210 and the EML 226. The HIL 224 is located between the light compensation layer 222 and the EML 226.

Alternatively, the light compensation layer 222 may be located between the HIL 224 and the EML 226.

Although not shown, an HTL may be located between the HIL 224 and the EML 226.

In the anode 210, the first and second transparent electrode layers 212 and 216 may be each formed of a transparent conductive material such as ITO or IZO, and the reflective electrode layer 214 may be formed of a highly reflective material such as Al or an APC alloy.

The cathode 230 may be formed of one selected from among Al, Mg, and an Al—Mg alloy, and have a thin thickness to transmit light therethrough The EML 226 may include an inorganic emitting material such as quantum dots or an organic emitting material. That is, the electroluminescent display device 100 according to the present disclosure may be an OLED display device or a QLED display device.

The light compensation layer 222 has a refractive index lower than those of the HIL 224 and the EML 226. The light compensation layer 222 may have a first refractive index. The HIL 224 and the EML 226 may respectively have second and third refractive indices. The difference between the first and second refractive indices and the difference between the first and third indices may be 0.4 or more.

For example, the first refractive index may be about 1.2 to 1.6. The second and third refractive indices may be each about 1.6 to 2.0. The second refractive index and the third refractive index may be substantially the same.

The light compensation layer 222 has a thickness smaller than those of the HIL 224 and the EML 226. For example, the thickness of the light compensation layer 222 may be about ⅖ to 1/10 times that of the HIL 224, and may be ⅕ to 1/20 times that of the EML 226.

In the electroluminescent device D, a hole from the anode 210 and an electron from the cathode 230 combine with each other in a recombination zone RZ located in the EML 226, and thus light is emitted.

A part of light emitted from the EML 226 is reflected at a boundary between the HIL 224 and the light compensation layer 222 toward the cathode 230. The remaining light is reflected from the reflective electrode layer 214 toward the cathode 230.

That is, in the present disclosure, light is reflected within the organic emissive layer 220, and the reflection of the light within the organic emissive layer 220 is referred to as the soft cavity effect.

In other words, as the light compensation layer 222 having a low refractive index is arranged below the HIL 224 or between the HIL 224 and the EML 226, the cavity phenomenon occurs in the organic emissive layer 220. Accordingly, the luminous efficiencies, i.e., the brightnesses, of the electroluminescent device D and the electroluminescent display device 100 are improved Additionally, the recombination zone RZ is located at a center of the EML 226, thus increasing the soft cavity effect of the electroluminescent device D and the electroluminescent display device 100.

Figure 7:
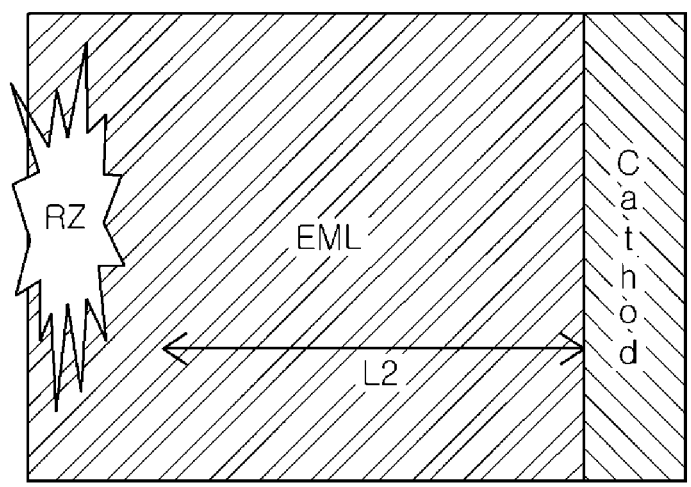
FIG. 7 is a diagram for explaining a cavity phenomenon occurring in an electroluminescent device according to the present disclosure.

That is, referring to FIG. 7 which is a diagram for explaining the cavity phenomenon occurring in an electroluminescent device according to the present disclosure, when the EML 226 is located on the cathode 230 without the ETL 128 of FIG. 5 to be in contact with the cathode 230, injection of electrons is not delayed and thus a recombination zone RZ moves to a center of the EML 226. Accordingly, a distance L2 between the recombination zone RZ and the cathode 230 for achieving a cavity is secured, thus increasing the soft cavity effect. Therefore, the luminous efficiencies, i.e., the brightnesses, of the electroluminescent device D and the electroluminescent display device 100 are greatly improved FIGS. 8A and 8B are graphs showing characteristics of an electroluminescent device according to whether an ETL is provided or not.

Figure 8A:
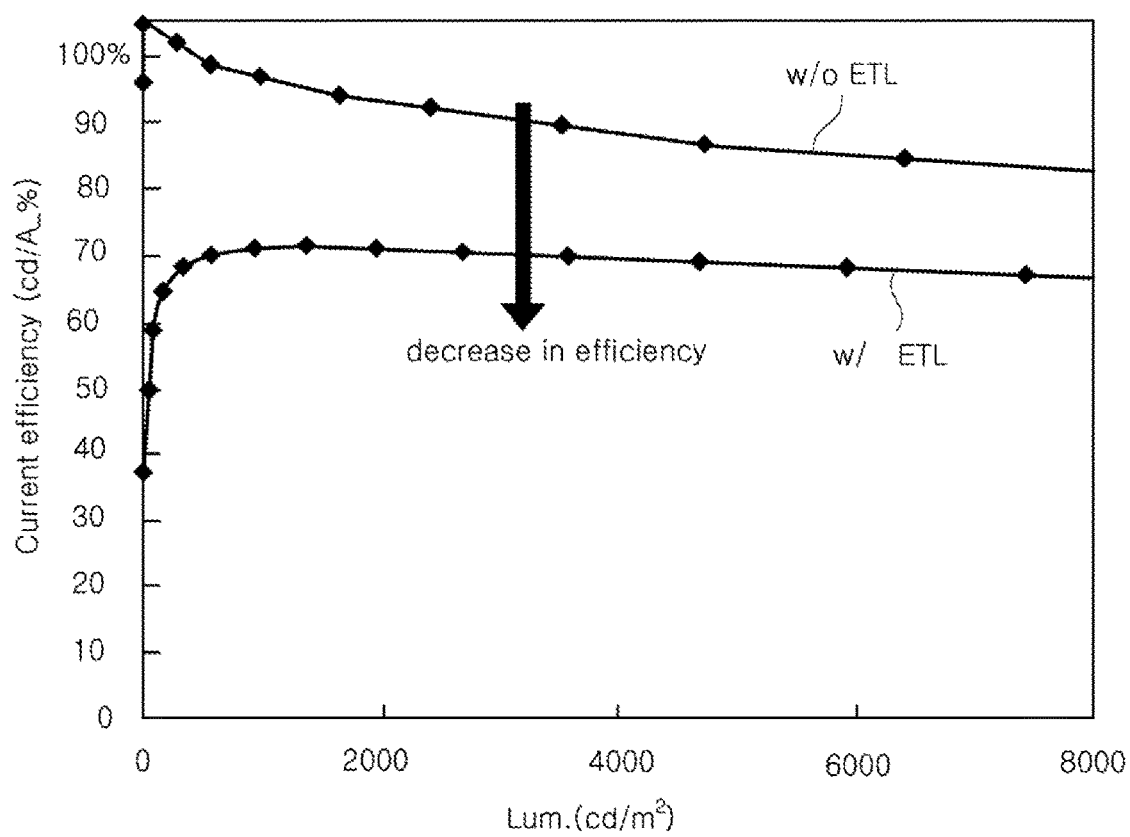
FIGS. 8A and 8B are graphs showing characteristics of an electroluminescent device according to whether an electron transporting layer (ETL) is provided or not.
Figure 8B:
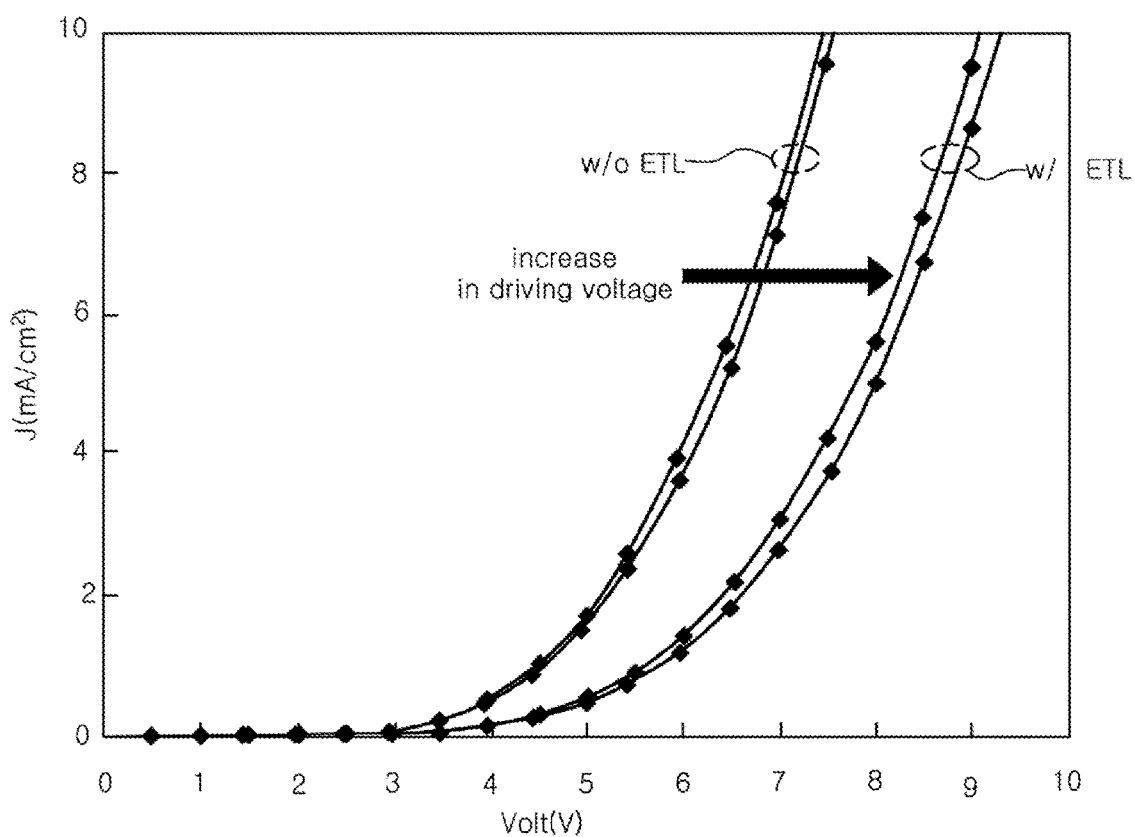

As illustrated in FIGS. 8A and 8B, the brightness of an electroluminescent device (without an ETL) in which an EML is in contact with a cathode without an ETL is improved and a driving voltage thereof is low, when compared to an electroluminescent device (with an ETL) including an ETL.

Figure 9A:
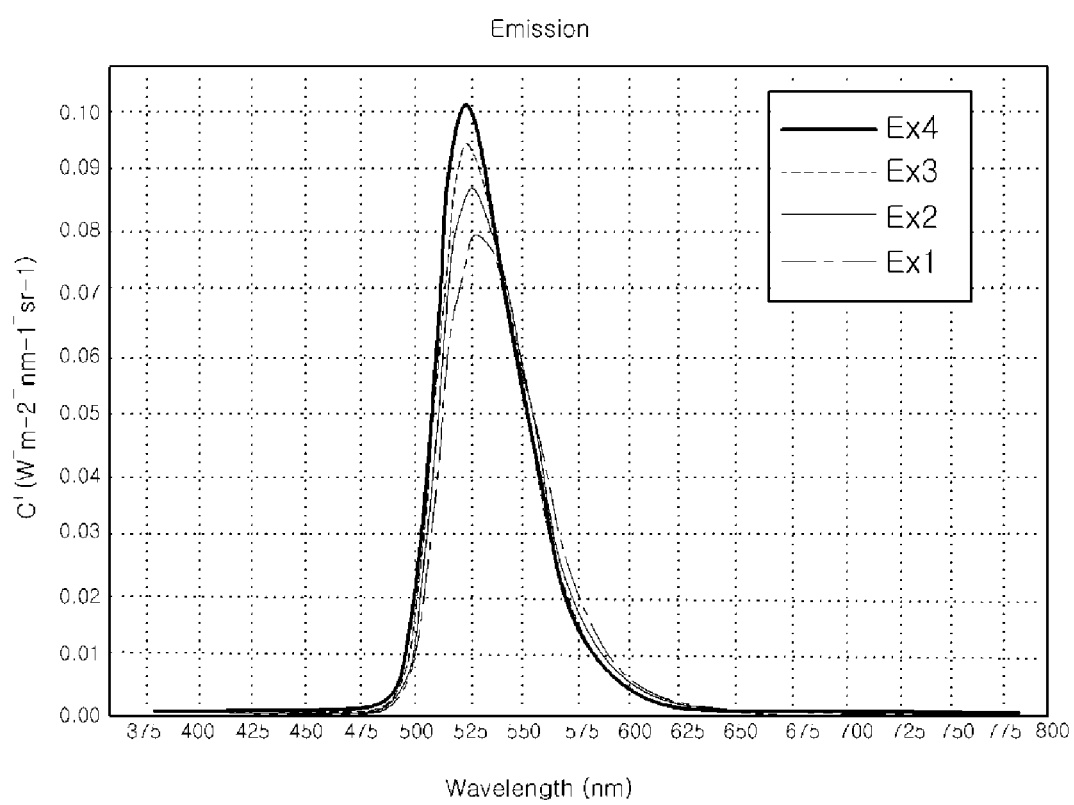
FIGS. 9A to 9C are graphs showing characteristics of an electroluminescent device according to whether a light compensation layer is provided or not.
Figure 9B:
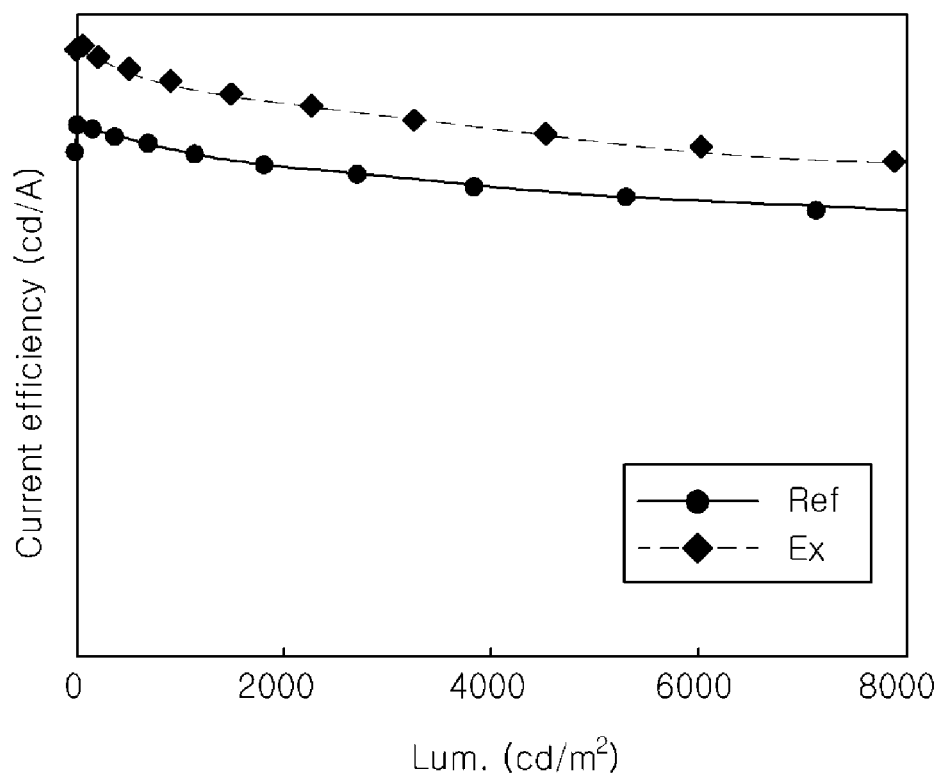
Figure 9C:
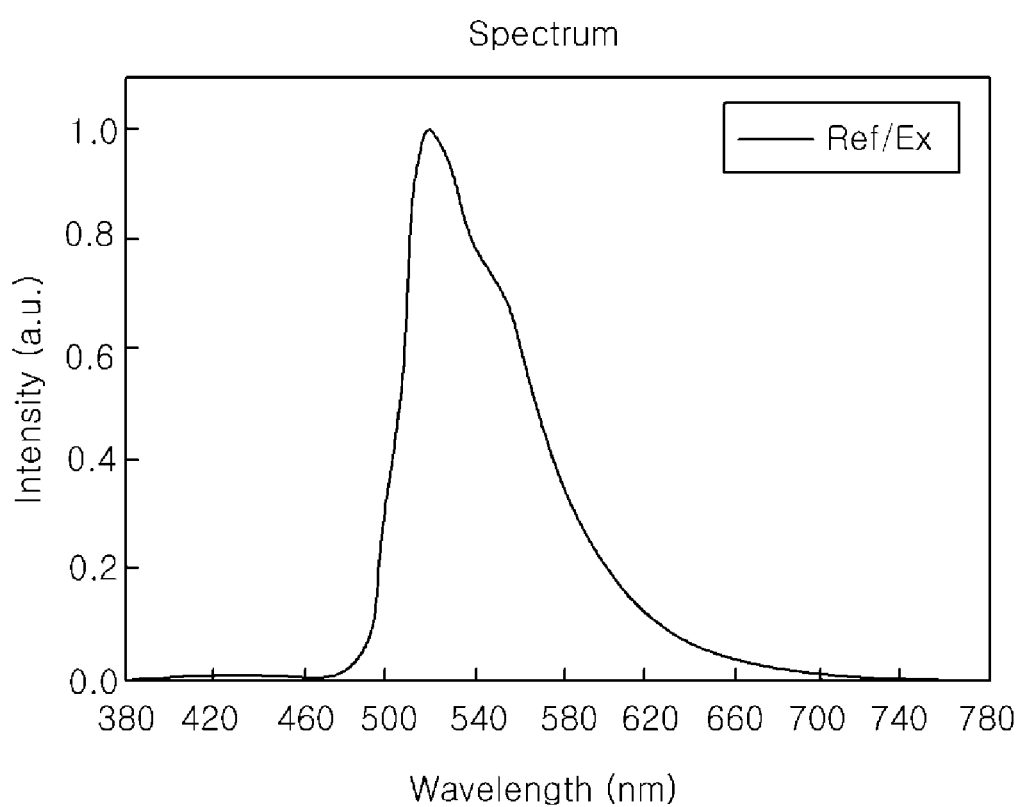

FIGS. 9A to 9C are graphs showing characteristics of an electroluminescent device according to whether a light compensation layer is provided or not.

As illustrated in FIG. 9A, the brightness of an electroluminescent device including a light compensation layer (refractive index=1.8 (Ex1), 1.6 (Ex2), 1.4 (Ex3), or 1.2 (Ex4)), a HTL (refractive index=1.8), and an EML (refractive index=1.8) is higher. When the difference between refractive indices of the light compensation layer, the HTL, and the ELM is high, the soft cavity effect increases and thus the brightness of the electroluminescent device increases.

Furthermore, as illustrated in FIG. 9B, the brightness of an electroluminescent device Ex including a light compensation layer is higher than that of an electroluminescent device Ref not including the light compensation layer.

As illustrated in FIG. 9C, luminous characteristics (a light-emitting wavelength) are not changed due to the light compensation layer. That is, luminous efficiency is improved due to the light compensation layer without degradation of luminous characteristics.

Figure 10:
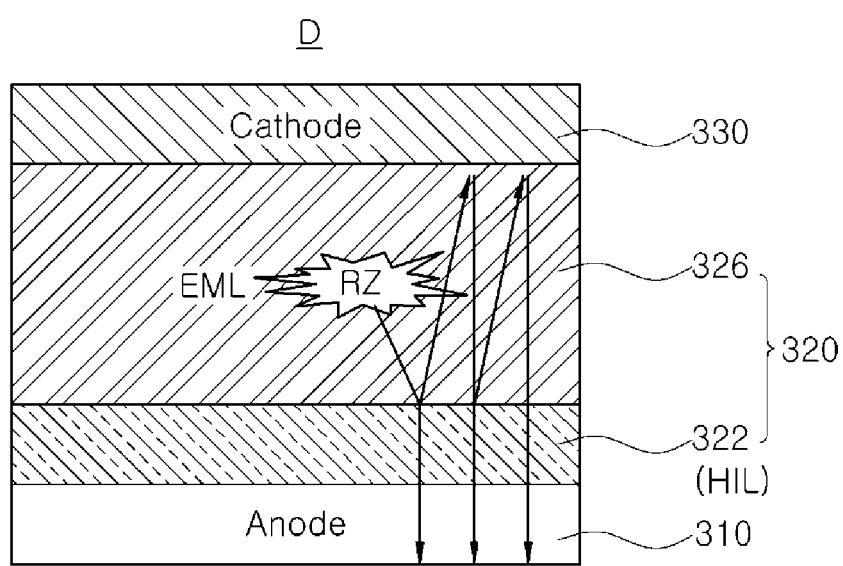
FIG. 10 is a schematic cross-sectional view showing an electroluminescent device according to a third embodiment of the present disclosure.

FIG. 10 is a schematic cross-sectional view showing an electroluminescent device according to a third embodiment of the present disclosure.

As illustrated in FIG. 10, an electroluminescent device D according to a third embodiment of the present disclosure, may include an anode 310, a cathode 330 facing the anode 310, and an organic emissive layer 320 located between the anode 310 and the cathode 330 and including a light compensation layer 322 and an EML 326.

The light compensation layer 322 and the EML 326 are sequentially stacked on the anode 310. That is, the EML 326 is located between the anode 310 and the cathode 330 and is in contact with the cathode 330. Additionally, the light compensation layer 322 is located between the anode 310 and the EML 326, and is in contact with the anode 310 and the EML 326.

The light compensation layer 322 serves as a HIL.

Although not shown, a HTL may be located between the light compensation layer 322 and the EML 326

The anode 310 may be formed of a transparent conductive material such as ITO or IZO. The cathode 330 is formed of one selected from among Al, Mg, and an Al—Mg alloy, and serves as a reflective electrode.

The EML 326 may include an inorganic emitting material such as quantum dots or an organic emitting material. That is, an electroluminescent display device according to the present disclosure may be an OLED display device or a QLED display device.

The light compensation layer 322 has a refractive index lower than that of the EML 326. The light compensation layer 322 may have a first refractive index, and the EML 326 may have a second refractive index. The difference between the first and second refractive indices may be 0.4 or more.

For example, the first refractive index may be about 1.2 to 1.6. The second refractive index may be about 1.6 to 2.0.

Furthermore, the light compensation layer 322 has a thickness smaller than that of the EML 326. For example, the thickness of the light compensation layer 322 may be about ⅕ to 1/20 times that of the EML 326.

In the electroluminescent device D described above, a hole from the anode 310 and an electron from the cathode 230 combine with each other in a recombination zone RZ located in the EML 326 and thus light is emitted Light emitted from the EML 326 is reflected at a boundary between the ELM 326 and the light compensation layer 322 and from the cathode 330. Thus, luminous efficiency is improved due to the soft cavity effect.

In other words, as the light compensation layer 322 having a low refractive index is arranged between the EML 326 and the anode 310, the cavity phenomenon occurs in the organic emissive layer 320. Accordingly, the luminous efficiencies, i.e., the brightnesses, of the electroluminescent device D and the electroluminescent display device 100 are improved.

Furthermore, since the EML 326 is in contact with the cathode 330 without the ETL 128 of FIG. 5, the recombination zone RZ is located at a center of the EML 326, thus increasing the soft cavity effect of the electroluminescent device D and the electroluminescent display device 100.

Therefore, the luminous efficiencies, i.e., the brightnesses, of the electroluminescent device D and the electroluminescent display device 100 are greatly improved.

According to the present disclosure, an emissive layer located between an anode and a cathode includes a light compensation layer having low-refractive index characteristics. Thus, the soft cavity effect occurs in the emissive layer.

Accordingly, the luminous efficiencies of an electroluminescent device and an electroluminescent display device are improved.

Additionally, since an EML is in direct contact with a cathode without an EIL, the soft cavity effect is improved and thus the luminous efficiencies of the electroluminescent device and the electroluminescent display device are further improved.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An electroluminescent device comprising:
   an anode and a cathode facing each other;
   a light compensation layer located between the anode and the cathode, the light compensation layer having a first refractive index;
   an emitting material layer located between the light compensation layer and the cathode, the emitting material layer having a second refractive index higher than the first refractive index; and a hole injection layer located between the emitting material layer and the light compensation layer or between the light compensation layer and the anode, wherein the hole injection layer has a third refractive index higher than the first refractive index, and wherein the light compensation layer has a thickness smaller than a thickness of the emitting material layer and a thickness of the hole injection layer.

2. The electroluminescent device of claim 1, wherein a difference between the first refractive index and the second refractive index is 0.4 or more.

3. The electroluminescent device of claim 1, wherein the emitting material layer is in contact with the cathode.

4. The electroluminescent device of claim 1, wherein the anode comprises a first transparent electrode layer.

5. The electroluminescent device of claim 4, wherein the anode further comprises:
   a second transparent layer facing the first transparent electrode layer; and
   a reflective electrode layer located between the first and second transparent electrode layers.

6. An electroluminescent display device comprising:
   a substrate;
   an electroluminescent device located on the substrate, the device comprising:
      an anode and a cathode facing each other,
      a light compensation layer located between the anode and the cathode, the light compensation layer having a first refractive index,
      an emitting material layer located between the light compensation layer and the cathode, the emitting material layer having a second refractive index higher than the first refractive index, and
      a hole injection layer located between the emitting material layer and the light compensation layer or between the light compensation layer and the anode; and
   a thin-film transistor located between the substrate and the electroluminescent device, and connected to the electroluminescent device,
   wherein the hole injection layer has a third refractive index higher than the first refractive index, and
   wherein the light compensation layer has a thickness smaller than a thickness of the emitting material layer and a thickness of the hole injection layer.

7. The electroluminescent device of claim 6, wherein a difference between the first refractive index and the second refractive index is 0.4 or more.

8. The electroluminescent device of claim 6, wherein the emitting material layer is in contact with the cathode.

9. The electroluminescent device of claim 6, wherein the light compensation layer has a thickness smaller than those of the emitting material layer and the hole injection layer.

10. The electroluminescent device of claim 6, wherein the anode comprises a first transparent electrode layer.

11. The electroluminescent device of claim 10, wherein the anode further comprises:
    a second transparent layer facing the first transparent electrode layer; and
    a reflective electrode layer located between the first and second transparent electrode layers.

12. An electroluminescent device comprising:
    an anode and a cathode facing each other, the anode comprising:
       a first transparent electrode layer,
       a second transparent layer facing the first transparent electrode layer, and
       a reflective electrode layer located between the first and second transparent electrode layers;
    a light compensation layer located between the anode and the cathode, the light compensation layer having a first refractive index; and
    an emitting material layer located between the light compensation layer and the cathode, the emitting material layer having a second refractive index higher than the first refractive index,
    wherein a hole injection layer has a third refractive index higher than the first refractive index.

* * * * *